(12) United States Patent
deVilliers et al.

(10) Patent No.: US 9,987,655 B2
(45) Date of Patent: Jun. 5, 2018

(54) INLINE DISPENSE CAPACITOR SYSTEM

(71) Applicant: Tokyo Electron Limited, Minato-ku, Tokyo (JP)

(72) Inventors: Anton J. deVilliers, Clifton Park, NY (US); Ronald Nasman, Averill Park, NY (US); James Grootegoed, Wynantskill, NY (US); Norman A. Jacobson, Jr., Scotia, NY (US)

(73) Assignee: Tokyo Electron Limited, Tokyo (JP)

( * ) Notice: Subject to any disclaimer, the term of this patent is extended or adjusted under 35 U.S.C. 154(b) by 193 days.

(21) Appl. No.: 15/188,394

(22) Filed: Jun. 21, 2016

(65) Prior Publication Data

US 2016/0375459 A1    Dec. 29, 2016

Related U.S. Application Data

(60) Provisional application No. 62/185,233, filed on Jun. 26, 2015.

(51) Int. Cl.
| | |
|---|---|
| *B05C 11/00* | (2006.01) |
| *B05C 9/00* | (2006.01) |
| *B05C 11/10* | (2006.01) |
| *F04B 13/00* | (2006.01) |
| *F04B 43/00* | (2006.01) |

(Continued)

(52) U.S. Cl.
CPC ............ B05C 11/1002 (2013.01); B05C 9/00 (2013.01); F04B 13/00 (2013.01); F04B 13/02 (2013.01); F04B 43/00 (2013.01); F04B 43/0072 (2013.01); F04B 43/0081 (2013.01); F04B 43/086 (2013.01); F04B 43/107 (2013.01); G03F 7/16 (2013.01); G03F 7/30 (2013.01); H01L 27/00 (2013.01);

(Continued)

(58) Field of Classification Search
CPC ......... B05C 11/1002; B05C 9/00; F04B 7/00; F04B 13/00; F04B 13/02; F04B 43/00; F04B 43/0072; F04B 43/0081; F04B 43/086; F04B 43/107; G03F 7/16; G03F 7/30; H01L 27/00; H01L 21/67017
USPC ................................................. 700/231–244
See application file for complete search history.

(56) References Cited

U.S. PATENT DOCUMENTS

| | | | |
|---|---|---|---|
| 4,195,810 A | * | 4/1980 | Lavin ........................ F16K 7/07 251/5 |
| 4,442,954 A | * | 4/1984 | Bergandy ................ F16K 7/045 137/488 |

(Continued)

*Primary Examiner* — Michael Collins
(74) *Attorney, Agent, or Firm* — Oblon, McClelland, Maier & Neustadt, L.L.P.

(57) ABSTRACT

A fluid dispensing apparatus and method is disclosed. Systems include an in-line or linear bladder apparatus array configured to expand to collect a charge of fluid, and contract to assist with fluid delivery and dispensing. The bladder array is disposed within a chamber of pressure control fluid common to exterior surfaces of each bladder in the bladder array. Simultaneously, some bladders within the array of linear bladders can be dispensing fluid or maintaining fluid while some bladders are collecting fluid. A given filtration rate can be less than a dispense rate and thus the system herein compensates for filter-lag that often accompanies fluid filtering for microfabrication, while providing a generally linear configuration that reduces chances for defect creation. With multiple bladders, multiple different types of fluid can be readied for selective dispense.

15 Claims, 4 Drawing Sheets

(51) Int. Cl.
  *G03F 7/16* (2006.01)
  *F04B 13/02* (2006.01)
  *F04B 43/08* (2006.01)
  *F04B 43/107* (2006.01)
  *G03F 7/30* (2006.01)
  *H01L 27/00* (2006.01)
  *H01L 27/11582* (2017.01)
  *H01L 21/67* (2006.01)
  *F04B 7/00* (2006.01)

(52) U.S. Cl.
  CPC .......... *H01L 27/11582* (2013.01); *F04B 7/00* (2013.01); *H01L 21/67017* (2013.01)

(56) References Cited

U.S. PATENT DOCUMENTS

| | | | |
|---|---|---|---|
| 6,568,416 B2* | 5/2003 | Tucker | G05D 16/2053 137/14 |
| 9,718,082 B2* | 8/2017 | deVilliers | B05C 5/0225 |
| 2015/0241778 A1* | 8/2015 | Kato | G03F 7/70791 355/67 |
| 2018/0046082 A1* | 2/2018 | deVilliers | G03F 7/16 |
| 2018/0047562 A1* | 2/2018 | deVilliers | H01L 21/0275 |

* cited by examiner

INLINE DISPENSE CAPACITOR SYSTEM

CROSS REFERENCE TO RELATED APPLICATIONS

The present application claims the benefit of U.S. Provisional Patent Application No. 62/185,233, filed on Jun. 26, 2015, entitled "Inline Dispense Capacitor System," which is incorporated herein by reference in its entirety.

BACKGROUND OF THE INVENTION

This disclosure relates to semiconductor fabrication, and, in particular, to film dispensing/coating and developing processes and systems.

Various processes on coater/developer tools specify different chemicals to be dispensed onto a substrate or wafer for specific types of processing. For example, various resist (photoresist) coatings can be dispensed onto a substrate surface. Also, various developers and solvents can be dispensed onto a wafer. One challenge, however, in dispensing various chemicals onto a wafer is avoiding defects in the dispensed chemicals. Any small impurity or coagulation in the chemical can create defects on a wafer. As semiconductor features continue to decrease in size, avoiding and removing defects from dispensed chemicals becomes increasingly important.

SUMMARY

One option to avoid defects from liquids dispensed onto a substrate is to purchase pre-filtered chemistry for use in a coater/developer tool. Such pre-filtered chemistry, however, can be very expensive and can develop defects in the chemistry during transport or use despite pre-filtering. Another option to avoid defects is to filter chemicals at a semiconductor fabrication tool (for example, coater/developer) immediately prior to dispensing on a substrate. One complication with filtering immediately prior to dispensing (point of use filtering) is a reduction in flow rate. For example, to deliver fluid that has been sufficiently filtered to meet purity requirements, relatively fine filters are required. A challenge with using fine filters is that such filters decrease a rate of fluid flow of a given chemistry as the fluid chemistry is being pushed through these relatively fine filters. Many semiconductor fabrication processes require specific chemistries to be dispensed at a flow rate that adheres to specified parameters. Having a flow rate above or below such a given specified flow rate can result in defects on a substrate. In other words, it is difficult to push a fluid through increasingly fine filters fast enough, or at an acceptable rate.

Techniques disclosed herein provide a system that compensates for relatively slow fluid filtering rates while simultaneously providing specified dispense flow rates. In other words, systems herein can dispense a filtered liquid onto a substrate at a dispense rate faster than a filtration rate. Such a system can include one or more a dispense capacitors located between a filter and a dispense nozzle. The dispense capacitor includes a flexible membrane or surface that selectively flexes to either increase or decrease fluid flow and/or pressure. Furthermore, the dispense capacitor defines a linear fluid conduit free from defect-inducing geometry. In one embodiment, the system can include one or more bladders or flexible line components that can flex outwardly to increase an amount of fluid within each delivery line between a given filter and a corresponding dispense nozzle, and/or that can contract to decrease an amount of fluid in the delivery line such as to maintain a specific pressure and/or flowrate. Such a system is advantageous in that a given dispensed chemical fluid can be filtered immediately prior to being dispensed on a wafer, using a relatively fine filter, and while still maintaining a specified dispense rate that can be faster than a filtration rate.

Another challenge with fluid dispense systems is the ability to dispense multiple different types of fluids, especially from a single tool such as a coater/developer tool used to coat substrates such as semiconductor wafers. Conventionally, dispensing different types of fluids involves manually swapping chemistry sources and cleaning conduit lines prior to a chemistry change, or, alternatively, having multiple tools spread across a relatively large area with each tool (dispense system) functioning with a single chemistry. Techniques herein, however, provide a multi-fluid dispense system without requiring a separate pump on the system for each fluid. Moreover, the system is configured with a set of dispense bladders that can controllably collect a charge of fluid, hold a charge of fluid, and dispense a charge of fluid. Each dispense bladder within the set can be independently operated such that some bladders can be dispensing while other bladders are collecting a charge or holding a charge of fluid.

One embodiment includes an apparatus for fluid delivery. The apparatus comprises a pressurized fluid housing defining a pressure-control chamber. The pressurized fluid housing is configured to contain a common pressure-control fluid. A plurality of bladders is positioned within the pressure-control chamber. The plurality of bladders having respective bladder process fluid inlets and bladder process fluid outlets. Each respective bladder process fluid inlet is connected to a corresponding chamber process fluid inlet of the pressure-control chamber. Each respective bladder process fluid outlet is connected to a corresponding chamber process fluid outlet of the pressure-control chamber. Each bladder defines a linear flow path between a respective bladder process fluid inlet and a corresponding bladder process fluid outlet. Each bladder being configured to expand and contract within the pressure-control chamber such that a volume defined by each bladder is changeable. Each bladder is configured to receive process fluid from a respective pressure-control delivery system configured to controllably adjust fluid pressure of process fluid delivered to each bladder. The pressure-control chamber is configured to contain a common pressure-control fluid such that when the pressure-control chamber is filled with the common pressure-control fluid, the common pressure-control fluid is in contact with an exterior surface of each bladder of the plurality of bladders. The pressure-control chamber including a chamber pressure-control mechanism that selectively increases or decreases a fluid pressure of the common pressure-control fluid resulting in an increase or decrease in pressure exerted on exterior surfaces of each bladder. A controller is configured to activate the chamber pressure-control mechanism and selectively increase or decrease the fluid pressure of the pressure-control fluid exerted on each bladder such that the volume defined by each bladder selectively increases or decreases according to process fluid pressure within each bladder.

Another embodiment includes a method for controlling delivery of multiple process fluids. This method includes receiving respective process fluids in each bladder of a plurality bladders positioned within a pressure-control chamber. Each bladder defines a linear flow path through the pressure-control chamber. Each bladder is configured to expand and contract within the pressure-control chamber such that a volume defined by each bladder is adjustable. Respective process fluids received from respective pressure-control delivery systems are configured to controllably adjust fluid pressure of process fluid delivered to each bladder. A common pressure-control fluid contained within the pressure-control chamber is maintained. The common pressure-control fluid exerts a common pressure on an exterior surface of each bladder of the plurality of bladders within the pressure-control chamber. Process fluid volume within each bladder is selectively increased, decreased, or maintained by controlling pressure of the common pressure-control fluid, and by controlling delivery pressure of respective process fluids, and by controlling dispense valves corresponding to each bladder.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
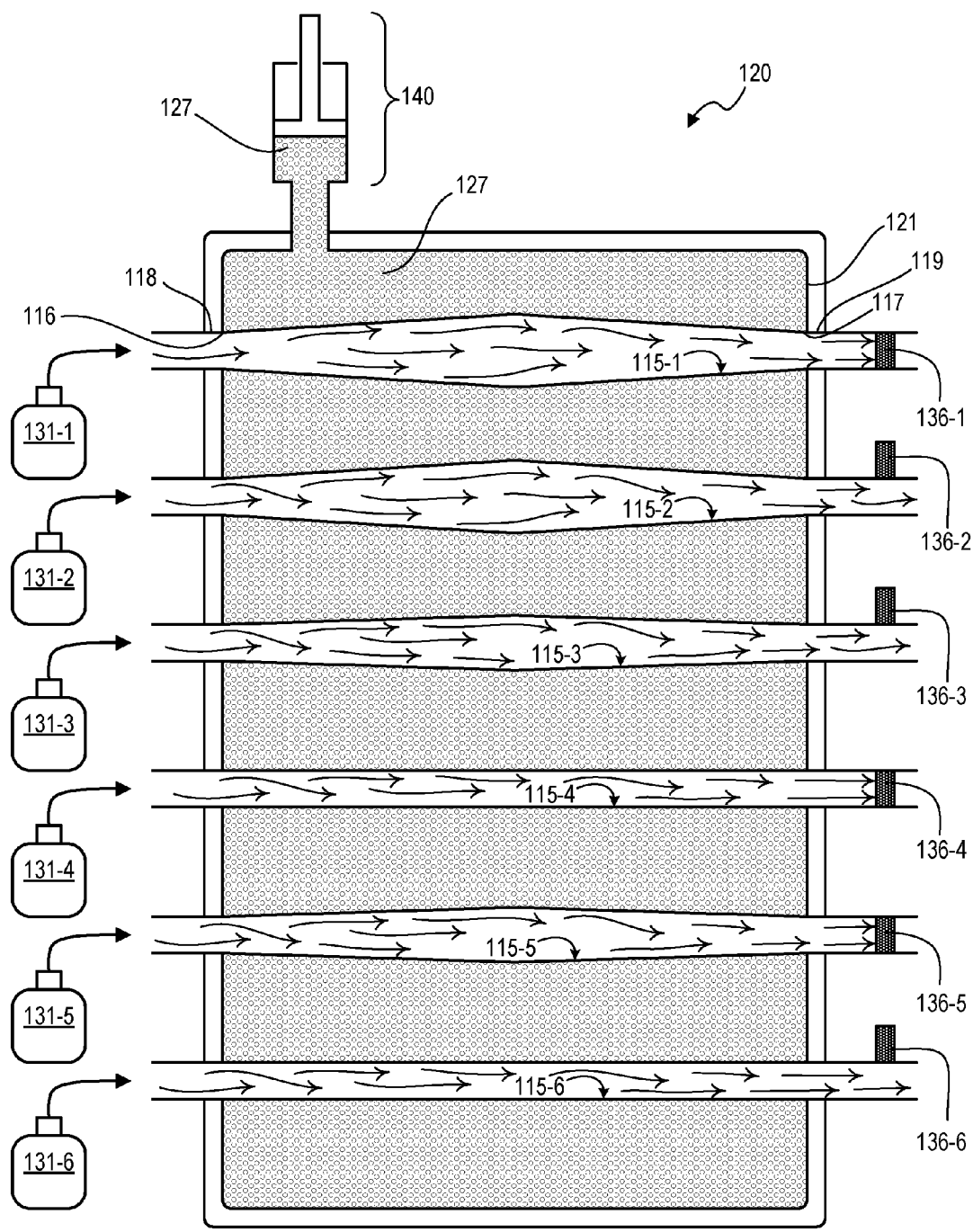
FIG. 1 is a cross-sectional schematic view of a dispense capacitor array as described herein.

Techniques herein can be embodied as an in-line dispense system that compensates for filter-lag, which often accompanies fluid filtering for microfabrication. This dispense solution herein further reduces chances for defect creation. Conventionally, fluid delivery systems that have a "dead leg" hanging off a fluid line (such as for a pressure measuring device or reservoir) or have other discontinuities that result in a significant chance of creating defects in the fluid. Fluid connectors are designed to reduce imperfections on fluid conduit walls (inside walls). Any rough connectors or bends can cause places where fluid can recirculate, slow down, or otherwise get stopped which can cause coagulation. Thus, having a piston, baffle, or side-attached reservoir can create a lot of undesirable cross flow and places for fluid to get stuck or slow down. Such cross flow and slow spots can lead to particle creation within the fluid. Such particles then become defects when dispensed on a given substrate, such as a silicon wafer.

Accordingly, systems herein include an in-line (linear) bladder apparatus. Better fluid dispense results are achieved when this in-line bladder is configured as a through tube (approximately uniform cross-section) that does not allow fluid to have cross flows or slowing of fluid flow. During a dispense-off period—that is when fluid is not being dispensed from a corresponding nozzle onto a substrate—process fluid can collect in this bladder (as an expanding bladder) after the process fluid is pushed through a fine filter (micro filter). In one embodiment, a fluid dispense capacitor is configured to be filled with fluid having been filtered just prior to entering the dispense capacitor during a dispense-off period. In some example dispense applications a given fluid is dispensed at a predetermined flow rate (such as 0.4 to 1.4 cubic centimeters per second), and this fluid is dispensed (on to a substrate) for relatively short time such as for about one second and then the fluid dispense system may not be used again for a rest period. This rest period may be anywhere from about 15 seconds to 60 seconds or more.

When dispensing from the nozzle is reinitiated, the in-line bladder reverses from a state of collecting process fluid to state of expelling process fluid. In other words, this substantially linear bladder has the capacity to expand to collect a charge of process fluid and then be selectively compressed to assist with maintaining a particular process fluid flow rate by discharging a collected charge of fluid. Thus, such a configuration provides a system having a dispense capacitor, which includes a bladder or expandable member configured to expand to receive a charge of fluid and to contract to help expel a built-up charge of fluid, all while maintaining a substantially linear flow path of the process fluid through the bladder.

Expansion and contraction of the dispense capacitor can be accomplished via a coupled pneumatic or hydraulic system that controls a pressure control fluid surrounding the in-line bladder or surrounding a group of in-line bladders. There can be various cross-sectional shapes of the in-line bladder such as circular, square, and oval. For convenience in describing embodiments herein this disclosure will primarily focus on a bladder having an approximately oval or circular shape. Different cross-sectional shapes offer different advantages. One advantage with using a bladder having an oval cross-sectional shape is having two relatively flat opposing surfaces which can be the primary deflection surfaces for expansion and contraction. In cross-sectional shapes that are substantially uniform or symmetrical (such as a circular cross-section), all sidewall surfaces would be able to expand and contract roughly uniformly.

In addition to preventing defects, another challenge with dispensing fluid is an increased demand in different types of fluids to be dispense at different stages of substrate processing. This is especially true with trends in substrate patterning. To create smaller feature sizes, and due to the optical limitations of photolithography, increasing numbers of layers are specified for patterning such as for double patterning, quadruple patterning, self-aligned patterning, etc. Techniques herein, however, provide a dispense capacitor array that can deliver multiple different fluid types without requiring multiple pumps to assist with fluid dispense.

Referring now to FIG. 1, a simplified schematic of an apparatus for fluid delivery, such as an array of dispense capacitors, is illustrated and will be described herein. The apparatus includes a pressurized fluid housing 120 defining a pressure-control chamber 121. The pressurized fluid housing is a container or other apparatus that is configured or constructed to contain a common pressure-control fluid, or at least configured to contain fluid at a pressure greater than atmospheric pressure. Thus, pressurized-fluid housing refers to a housing or structure configured to receive and contain fluids under various pressures.

A plurality of bladders is positioned within the pressure-control chamber 121. A number of bladders selected for use in a given embodiment can be based on dispense requirements, available space, etc. In the example in FIG. 1, six bladders are depicted. This includes bladders 115-1, 115-2, 115-3, 115-4, 115-5, and 115-6. The plurality of bladders have respective bladder process fluid inlets and bladder process fluid outlets. Each respective bladder process fluid inlet 116 is connected to a corresponding chamber process fluid inlet 118 of the pressure-control chamber 121. Each respective bladder process fluid outlet 117 is connected to a corresponding chamber process fluid outlet 119 of the pressure-control chamber 121. Each bladder defines a linear flow path (or approximately linear flow path) between a respective bladder process fluid inlet and a corresponding bladder process fluid outlet. Each bladder is configured to expand and contract within the pressure-control chamber such that a volume defined by each bladder is changeable. Note that the pressure-control chamber 121 can be embodied in various shapes and configurations. For example, in some embodiments, the pressurized fluid housing 120 can define a pressure-control channel to accommodate multiple bladders.

Each bladder is configured to receive process fluid from a respective pressure-control delivery system configured to controllably adjust fluid pressure of process fluid delivered to each bladder. Pressure-control delivery systems 131-1, 131-2, 131-3, 131-4, 131-5, and 131-6 can include a fluid reservoir and mechanism to controllable deliver pressurized fluid to respective bladders 115. Such liquid packaging, containment and delivery systems are commercially available. Such pressure-control delivery systems can be connected to a central controller configured to control the bladder array, pressure-control deliver systems, as well as dispense components. Flow of process flow fluids through bladders 115 is controlled by dispense valves 136-1, 136-2, 136-3, 136-4, 136-5, and 136-6, which can selectively permit or block process fluid flow through the bladders.

The pressure-control chamber 121 is configured to contain a common pressure-control fluid 127 such that when the pressure-control chamber 121 is filled with the common pressure-control fluid 127, the common pressure-control fluid 127 is in contact with an exterior surface of each bladder of the plurality of bladders. The pressure-control chamber 121 includes a chamber pressure-control mechanism that selectively increases or decreases a fluid pressure of the common pressure-control fluid 127 resulting in an increase or decrease in pressure exerted on exterior surfaces of each bladder.

The apparatus can include a controller configured to activate the chamber pressure-control mechanism and selectively increase or decrease the fluid pressure of the pressure-control fluid exerted on each bladder such that the volume defined by each bladder selectively increases or decreases according to process fluid pressure within each bladder. Thus, as can be seen generally in FIG. 1, each bladder can be embodied as an expandable/shrinkable conduit, positioned within the pressure-control chamber 121, and essentially following a linear flow path from one side of the chamber to the other. Accordingly, respective process flow fluids can flow generally linearly through each bladder. By way of example, process flow fluids can include photoresist compositions, block copolymers, solvents, etc., for deposition on a given substrate. Thus, each bladder can have a bladder length that is greater than a bladder cross-sectional height. A process fluid pressure within a given bladder at a given time can be dependent on (1) fluid delivery pressure of process fluid (such as photoresist) from a respective pressure-control delivery system, (2) fluid pressure of the common pressure-control fluid, and (3) state of corresponding dispense valves.

For example, bladder 115-1 is in an expanded state. This can be due to process fluid delivery pressure being greater than pressure from common pressure control fluid 127, while dispense valve 136-1 is in an off position. Bladder 115-2 is at a state of starting a dispense operation. Bladder 115-2 is expanded holding a charge of process fluid, though dispense valve 136-2 is open and so process fluid begins to flow out of bladder 115-2, which will contract during this operation, in part due to pressure from pressure-control fluid 127. Bladder 115-3 shows a partially contracted bladder during a dispense operation (with dispense valve 136-3 open), while bladder 115-6 is shown fully contracted, such as at the end of a dispense operation after discharging a charge of process fluid, shown with dispense valve 136-6 open. After completion of a dispense cycle, a dispense valve is closed for collecting a charge of process fluid. For example, dispense valve 136-4 is closed so that bladder 115-4 can begin collecting a charge of process fluid. Bladder 115-5 is partially expanded (with dispense valve 136-5 closed) to show progress of charge collection. Thus, an array of bladders (also known as dispense capacitors for fluid dispense) can be arrayed within an enclosure that uses a common fluid for exerting a uniform and adjustable pressure on the array of bladders. Using corresponding pressure delivery systems and dispense valves, each bladder can be independently controlled for dispense, charge collection, or charge holding states, all with a single pressure regulating mechanism for the common pressure-control fluid.

Figure 2:
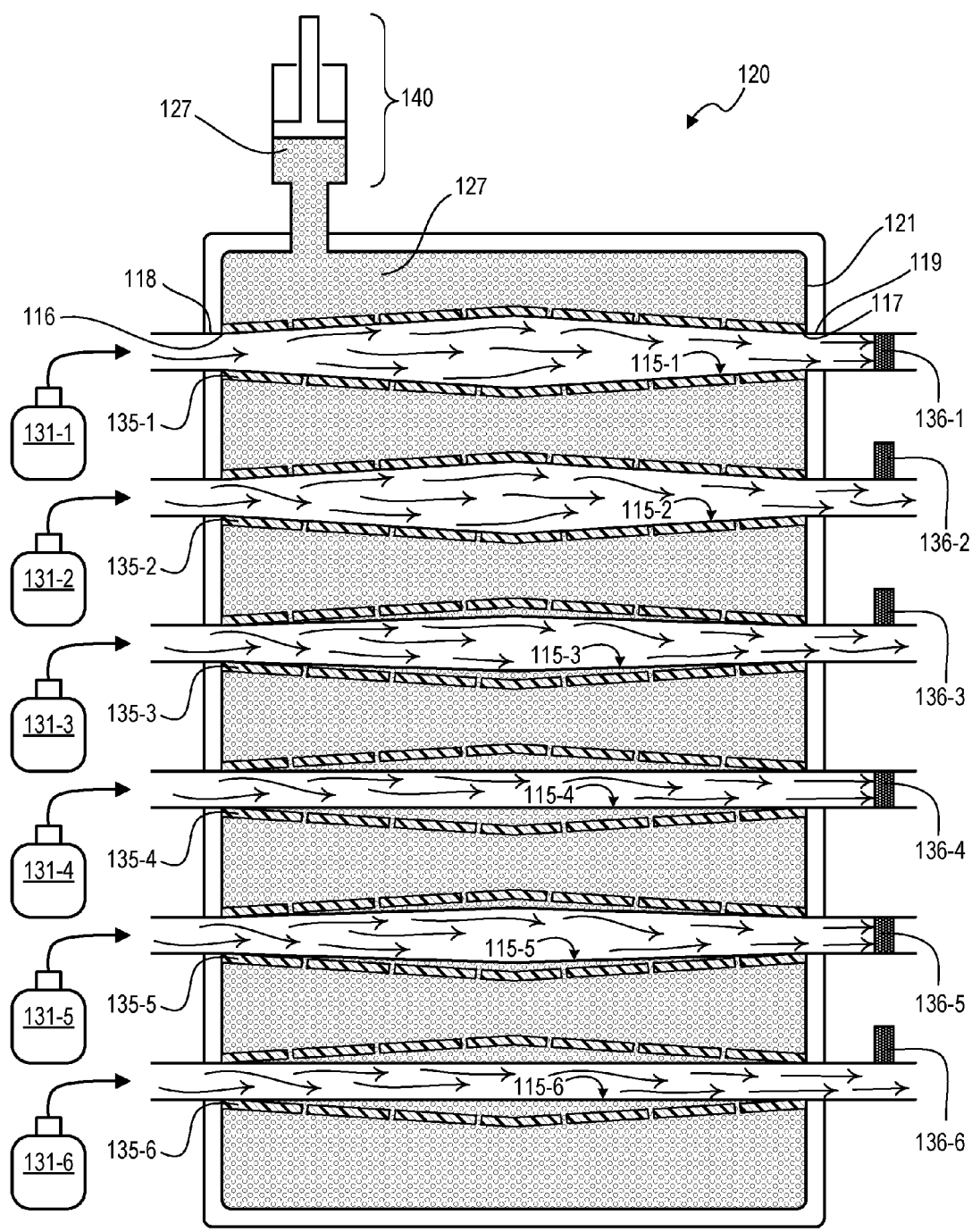
FIG. 2 is a cross-sectional schematic view of a dispense capacitor array as described herein.

Other embodiments can include using a bladder expansion constraint configured to physically limit expansion of each bladder to a respective maximum bladder volume. FIG. 2 illustrates one example embodiment of such a bladder expansion constraint. Shown are bladder expansion constraints 135-1, 135-2, 135-3, 135-4, 135-5, and 135-6. Note that the bladder expansion constraints can each define one or more openings that permit common pressure-control fluid to travel between each bladder and bladder-facing surfaces of the bladder expansion constraint. The bladder expansion constraint defines a surface for contact with an exterior surface of each bladder. The bladder expansion constraint essentially provides physical container that limits expansion of each bladder. In other words, as a given bladder increases in volume due to collecting a charge of process fluid, this bladder will expand until essentially filling a space defined by the bladder expansion constraint. At this point, process fluid pressure with a given bladder can increase, but without increasing an expanded volume of the bladder. For example, the bladder expansion constraint can be configured with sufficient surface area and rigidity such that after a respective bladder fully contacts the bladder expansion constraint, additional volumetric expansion of the bladder is limited to less than 1 percent of bladder volume at time of full contact with the bladder expansion constraint.

In the example embodiment of FIG. 2, the bladder expansion constraint is depicted as multiple bladder sleeves with each respective bladder sleeve positioned around each bladder, and each respective bladder sleeve approximately conforming to a shape of a corresponding expanded bladder. Note that the illustrated sleeve, in the example, is conical in shape with a base of such cone shapes having a widest diameter at about a center point of a length of each bladder. This allows a given bladder to expand more at a center point (farthest from process fluid inlets and outlets), with a gradual taper to process fluid inlets and outlets. Thus, the bladder expansion constraint can have an elongated shape with a center portion defining a larger cavity diameter as compared to end portions of the bladder expansion constraint.

As can be appreciated, there are many different bladder constraint designs that can be used herein. For example, the constraint can be a mesh tube, a perforated sleeve, paraboloid cavity, etc. In some embodiments, the constraint can be in the bladder material itself such as wire within a polymer material that limits expansion. In another example, instead of a sleeve constraint, the pressure-control chamber itself can be shaped to define bladder-facing surfaces that surround each bladder and define a bladder expansion shape with sufficient bladder contact surface area to physically restrain bladder expansion. Openings and spaces can be included with sufficient volume to contain pressure-control fluid to exert a same pressure on all of the bladders simultaneously.

The pressure-control chamber 121 includes a pressure-control mechanism that selectively increases or decreases a fluid pressure of the pressure-control fluid 127 exerted on an exterior surfaces of the bladders 115. A controller is configured to activate the pressure-control mechanism and selectively increase or decrease the fluid pressure of the pressure-control fluid 127 exerted on the exterior surfaces of the bladders 115. Such a pressure-control mechanism can include hydraulic unit 140, which can also be embodied as a pneumatic unit. Such a hydraulic unit 140 can be located outside of the pressure control chamber 121, with corresponding pressure control fluid inlet(s). In other embodiments, an entire side or section of the pressure control housing can be actuated to create pressure differentials.

In one embodiment, the pressure-control mechanism can include pulling pressure-control fluid 127 from the pressure-control chamber 121, and pushing pressure-control fluid 127 into the pressure-control chamber 121. Such a pressure-control mechanism or system can include using a pneumatic or hydraulic system that selectively increases or decreases a gas or liquid surrounding the bladders. Such a system can, for example, use a piston to move process control fluid into and out of the pressure-control chamber. In some embodiments, such a piston can be located outside of the pressure-control chamber. In other embodiments, a piston surface can define one wall or interior surface of the pressure-control chamber.

In other embodiments, such a hydraulic or pneumatic system can be entirely absent, and one of the bladders is configured for use as the chamber pressure-control mechanism. In such an embodiment, a corresponding dispense valve can be perpetually in an off position, and a corresponding process fluid deliver pressure system can be controlled to selectively increase and decrease pressure within the bladder, which in turn affects a pressure of the pressure control fluid.

Accordingly, in some embodiments, the controller can be configured to selectively expand a first portion of the bladders without expanding a second portion of the bladders. The controller can also be configured to selectively contract one or more bladders without contracting a second portion of the bladders. The controller can be configured to adjust the fluid pressure of the common pressure-control fluid to simultaneously dispense from one or more bladders while accumulating a charge of process fluid in one or more remaining bladders. The controller can also be configured to selectively control each respective pressure-control delivery system for each bladder. Thus, the controller can be configured to increase the fluid pressure of the pressure-control fluid while simultaneously causing a corresponding increase of process fluid pressure within each bladder of the second portion of bladders via respective pressure-control delivery systems.

The pressure control fluid can be any hydraulically compatible fluid such as mineral oil, oil, water, etc. Fluids can also include various gases. Alternatively a pneumatic system can be used for charging and discharging process flow fluid. Another alternative is a mechanical system that physically moves surfaces of the bladder inwardly or outwardly. The process flow fluid 110 can be any number of fluids used in a coating/developing or lithographic process. Process fluids can include photoresists, developers, etching fluids, polymeric fluids, and so forth. A given material selected for the pressurized fluid housing is preferably rigid relative to the bladder material. The bladder material can be selected from various flexible, yet fluid impermeable, materials such as various membranes, metals, Teflon, polymers, or elastomers, rubber, and Teflon-coated rubber materials. Essentially any material and/or material thickness that provides sufficient deflection to collect a volume of fluid and then push the collected volume of fluid towards an outlet or dispenser (nozzle).

Figure 3:
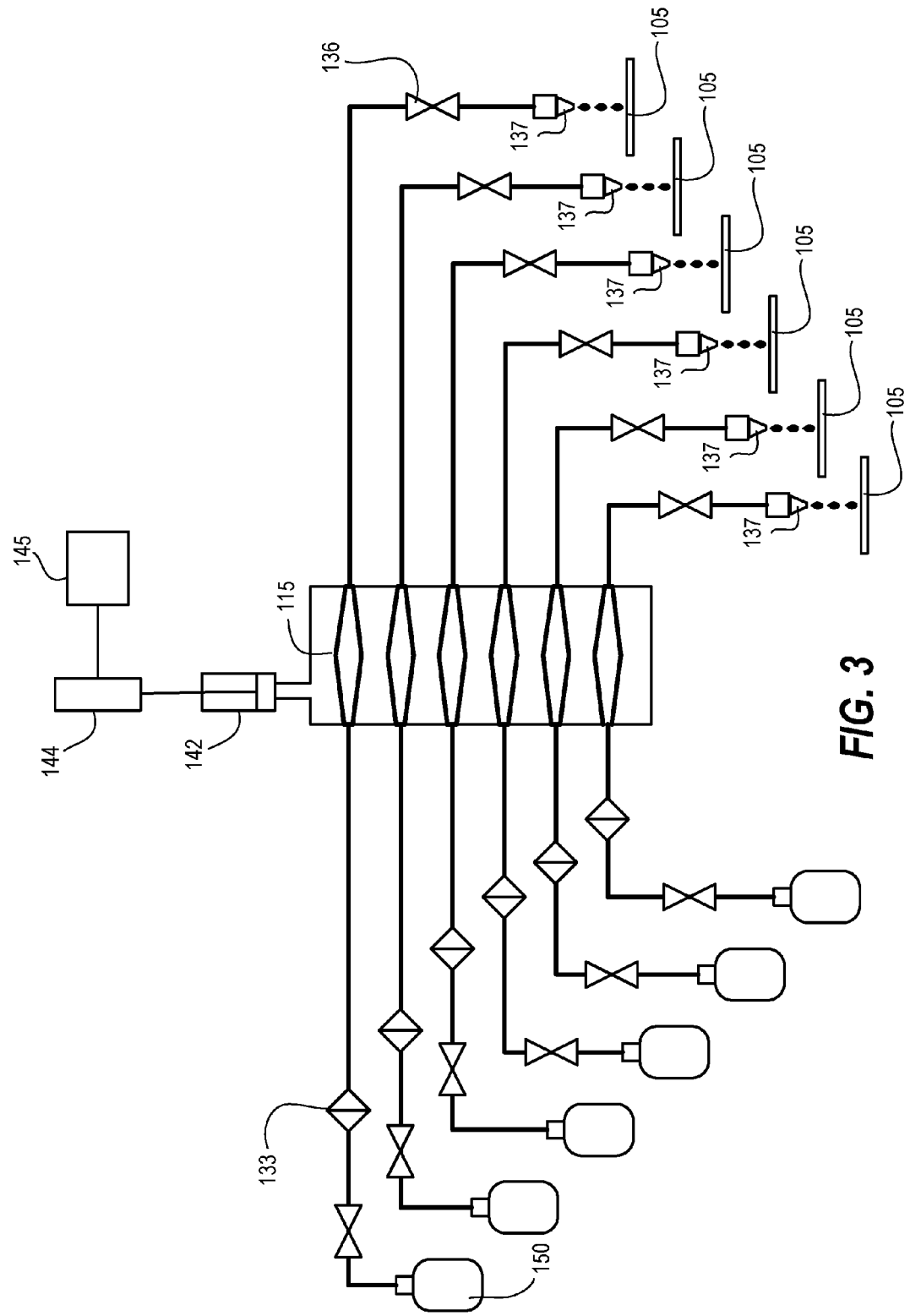
FIG. 3 is a simplified schematic of a control system for a dispense capacitor array as described herein.

FIG. 3 is a simplified control diagram illustrating use of an example fluid dispense apparatus. In operation, a given process fluid is stored in a pressure-controlled liquid ampoule 150. This pressure-controlled liquid ampoule can include a mechanism for driving process fluid from the ampoule toward a filter 133 via a conduit or pipe. Pushing process fluid through filter 133 can be a relatively slow process when using a high-purity filter. Example filtration rates can be slower than specified dispense rates for depositing process fluids onto a substrate 105. After a purified process flow fluid passes the filter 133, the process flow fluid begins collecting in the bladder 115 within the hydraulic housing. A piston 142 or plunger rod can be used to actuate the pressurized-fluid system. A linear drive 144, for example, can withdraw piston 142 thereby reducing the amount of pressure-control fluid in the pressure-control chamber. This enables the system to fine tune pressure exerted on each bladder.

Such a collection of a charge of process fluid can occur while dispense valve 136 is in an off position. Thus, process flow fluid collects within the bladder 115 inside the hydraulic housing pressurized fluid housing 120. With a sufficient amount of process flow fluid collected within the bladder, the dispense capacitor system can begin dispensing liquid on a given substrate via the nozzle 137 at a specified flow rate—which can be greater than a filtration rate. Pressure in the line can be maintained at the process flow fluid source (using pressure-controlled liquid ampoule 150) to prevent back flow through the high purity filter. This can be accomplished by having sufficient pressure to keep some amount of process flow fluid moving through filter 133 even while the bladder 115 is being compressed. With filter backflow prevented, the linear drive 144 moves piston 142 causing more pressure control fluid to enter the pressure-control chamber. The increase in pressure-control fluid essentially squeezes the bladder causing collected process flow fluid to continue through the system conduits or piping towards the nozzle and ultimately onto substrate 105, such as a target wafer. In some embodiments a diaphragm can be used in place of pressurized fluid housing for controlling the bladder.

Note that techniques herein can maintain continuity of flow through the filter 133. That is, while the bladder is charging and while a nozzle is dispensing process fluid can be flowing through the high purity filter. Even with a pressure drop across the filter during a dispense operation, fluid can continue moving through the filter. The advantage of maintaining a continuous flow—including continuous filtration—is that accumulated aggregates on a surface of the filter (caught by the filter) do not have a pressure condition to flow backward into solution. Other embodiments can include using a hydrostatic lock at a location in the line before a dispense valve, and at a hose portion between the filter and the dispense capacitor such that backflow is not possible. Another advantage is that embodiments can have zero dead space in the fluid delivery system, such as between a fluid source and a dispense nozzle. Having zero dead space further limits opportunities for defect creation.

A controller 145, such as a PID controller (proportional/integral/derivative) can be used to control pneumatic or hydraulic pressure to yield a specific flow rate of the process flow fluid as it exits the nozzle. After completion of fluid being dispensed at the nozzle, the nozzle can be closed and process flow fluid can begin again collecting in the bladder of the dispense capacitor system in preparation for a subsequent dispense operation or series of dispense operations. Note that a pressure sensor can be used to provide feedback to the PID controller. Alternatively, a pressure sensor can be integrated within the pressure-control chamber thereby eliminating a need for a separate T-connection for reading pressure of the process flow fluid during a dispense operation.

Figure 4:
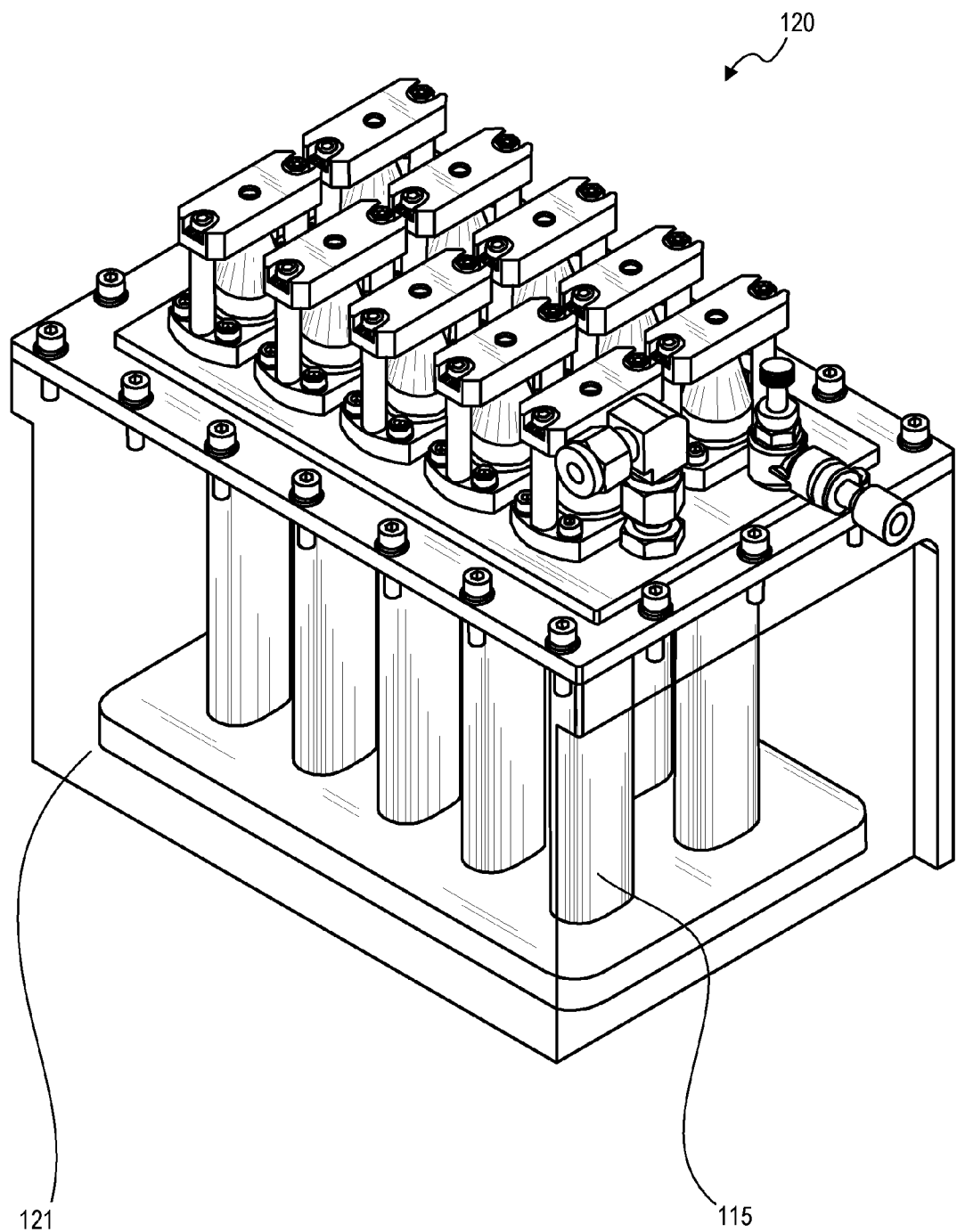
FIG. 4 is a perspective view of an example embodiment of a dispense capacitor array as described herein.

FIG. 4 is a perspective diagram with partial cut-away view of an example embodiment of a fluid delivery apparatus. FIG. 4 shows the pressurized fluid housing 120, the pressure-control chamber 121, and bladder 115. Note that bladder 115 can include flanges at fluid inlets and fluid outlets. Because the bladder will be expanding and contracting, securing ends of the bladder to the housing is beneficial to maintain proper operation. Flanges can be compressed around a lip to create a seal such that leakage of fluid is prevented and such that process flow fluid does not form defects due to slowing of fluid at such connection spots. Bladders can have a cross-sectional shape that is approximately oval in some embodiments. By using an oval-shaped bladder or rectangular bladder with rounded corners, deflection of the bladder can be designed to predominantly occur at opposing flat surfaces of this bladder.

Various materials can be selected for constructing the bladder. Example flexible materials can include rubber, synthetic rubber, elastomer, thin-walled metal, stainless steel, fluoropolymer elastomers, and so forth. In some embodiments, interior surfaces of the bladder can be coated for protection, defect reduction, etc. Interior coats can be comprised for chemical-resistant materials selected to resist photoresists and solvents such as ethyl lactate and cyclohexanone and others. Example chemical resistant materials include polytetrafluoroethylene (PTFE), and perfluoroalkoxy alkanes (PFA). Deposition can be accomplished by various deposition techniques including chemical vapor deposition (CVD) and filament-assisted CVD. For chemical vapor deposition techniques, a relatively low-pressure deposition environment can be used to ensure uniform coverage throughout a length of the bladder. An alternative embodiment is to over mold synthetic rubber or elastomer over a relatively thinner walled mold or insert made of a chemical resistant material such as polytetrafluoroethylene (PTFE), perfluoroalkoxy alkanes (PFA), fluoroelastomers, and so forth. In some embodiments, thin-walled metal can be used, though using PTFE/PFA fluid connectors with a metal bladder can be beneficial. Another embodiment includes two-shot molding with a chemical-resistant material is formed first as a liner, then an elastomer is formed to fill a remainder of a given mold. Other embodiments can use injection molding, blow molding, or machining of PFA, PTFE, and similar materials without rubber or an elastomer. Note that those skilled in the art will appreciate than many different types of materials and/or coatings can be selected specific to given process fluids to be flowed through the bladder.

The apparatus herein can be incorporated in semiconductor fabrication tools such as a coater/developer, lithographic tools, and cleaning systems. Systems herein can be optimized for fluids of various viscosities. It should be appreciated that various control circuits and mechanisms can be incorporated to optimize operation of the dispense apparatus. For example, pressure transducers, reducers, particle measurement systems, digital and analog inputs/outputs, microprocessors, power supplies, etc.

In other embodiments, the bladder is configured to expand longitudinally instead of laterally. In other words, the bladder stretches lengthwise to expand volumetrically to collect a charge of process fluid. For example, the bladder is selected from an elastomeric material. One or both ends of the bladder is secured to a movement apparatus that lengthens the bladder to accept more fluid, and then is contracted to discharge fluid. Such an embodiment can be configured with a round cross section with remains round during lengthening and contraction. Keeping the cross section round can reduce disruption in fluid flow pattern and provide less change of recirculating eddies. A controller with a linear actuator can be used to expand and contract the bladder. Thus hydraulics and pressure control fluid are not required. Optionally the bladder can be positioned within a rigid sleeve to keep a generally uniform bladder cross section during expansion, such as by preventing lateral expansion while lengthening and collecting a charge.

Embodiments can also include methods for controlling delivery of multiple process fluids. One method includes receiving respective process fluids in each bladder of a plurality bladders positioned within a pressure-control chamber. Each bladder defines a linear flow path through the pressure-control chamber. Each bladder is configured to expand and contract within the pressure-control chamber such that a volume defined by each bladder is adjustable. The respective process fluids received from respective pressure-control delivery systems, which systems are configured to controllably adjust fluid pressure of process fluid delivered to each bladder. A common pressure-control fluid contained within the pressure-control chamber is maintained. The common pressure-control fluid exerts a common or uniform pressure on an exterior surface of each bladder of the plurality of bladders within the pressure-control chamber. Process fluid volumes within each bladder can be selectively increased, decreased, or maintained by controlling pressure of the common pressure-control fluid, and by controlling delivery pressure of respective process fluids, and by controlling dispense valves corresponding to each bladder.

In some embodiments, selectively increasing, decreasing, or maintaining process fluid volume within each bladder can include increasing a first process fluid volume in a first bladder while simultaneously decreasing a second process fluid volume in a second bladder. Decreasing the second process fluid in the second bladder can include dispensing a charge of the second process fluid that had accumulated in an expanded second bladder. Dispensing the charge of the second process fluid can include adjusting pressure of the common pressure-control fluid to maintain a predetermined dispense rate. Increasing the first process fluid volume in the first bladder can includes accumulating a charge of first process fluid by expanding a volume of the first bladder. Selectively increasing, decreasing, or maintaining process fluid volume within each bladder can include causing respective pressure-control delivery systems to deliver process fluids to each bladder at a fluid pressure greater than the common pressure of the common pressure-control fluid exerted on exterior surfaces of each bladder.

Causing respective pressure-control delivery systems to deliver process fluids to each bladder at a fluid pressure greater than the common pressure of the common pressure-control fluid can include delivery at a pressure sufficient to cause increased volume of each bladder by expansion. Selectively increasing, decreasing, or maintaining process fluid volume within each bladder includes causing respective pressure-control delivery systems to deliver process fluids to each bladder at a fluid pressure greater than a threshold pressure for increasing each bladder to a volumetric bladder-expansion limit. Causing respective pressure-control delivery systems to deliver respective process fluids to each bladder at the fluid pressure greater than the threshold pressure for increasing each bladder to the volumetric bladder-expansion limit can include selectively expanding each bladder until each bladder is in physical contact with a corresponding bladder expansion constraint that prevents continued expansion of each bladder beyond a predetermined volume. Selectively expanding each bladder until each bladder is in physical contact with the corresponding bladder expansion constraint can include expanding each bladder to fill a respective sleeve surrounding each bladder, each respective sleeve defining one or more openings for ingress and egress of process control fluid. Two or more different process fluids can be received by the dispense system. Such multiple fluid dispensing can include dispensing a given process fluid from a given bladder onto a semiconductor wafer.

Controlling pressure of the common pressure-control fluid can include expanding or contracting at least one bladder. A hydraulic or pneumatic system coupled to the pressure-control chamber can be used to control pressure of the common pressure-control fluid.

Accordingly, techniques herein can be used to efficiently have multiple different process fluids filtered and ready for dispense as needed. In some embodiments, especially embodiments using a bladder expansion constraint, each pressure-control delivery system can be used, in cooperation with the pressure-control fluid and dispense valves to independently control expansion, contraction (dispense) and steady pressure states. Without having the bladder expansion constraints, embodiments can function using an effective bladder wall, such as by using material properties of bladder material to assist with pressure constraints. The pressure-control fluid can provide a baseline pressure or static frame of reference. By way of a non-limiting embodiment, pressure of the control fluid is set to 4 psi. One or more bladders can be dispensed against this baseline 4 psi pressure. If there is a pressure spike to this static frame of reference, then one or more bladders can be manipulated by increasing or decreasing pressure against the baseline pressure. Any pressure spikes can be tracked and neutralized, if desired, by controlling the chamber pressure-control mechanism. In some embodiments, pressure of the pressure-control fluid can be increased to provide steady pressure during dispense. Alternatively, pressure of non-dispensing bladders can be dropped during dispense while the pressure-control fluid remains at a steady state By way of another non-limiting example, ambient pressure within the dispense capacitor system can be set to move within 3-5 psi. All of the bladders can then be (initially) over pressured to about 9 psi. Such over pressurization causes the bladders to reach a volumetric expansion limit as they come in contact with bladder constraint surfaces. At this point, any additional pressure to the bladders will not cause additional expansion. In one operation, a first bladder initiates a dispense cycle. Pressure-control fluid can be tracked as a function of time during this dispense and adjusted as needed. This fluid pressure of the pressure-control fluid may need to be increased or decreased to compensate for valve open or close conditions. If the common fluid is not a constant 4 psi, a system can still dispense at a specified rate as the system controls the delta in pressures. The common fluid pressure can control a pressure downstream because pressure is proportional to downstream load, such as the load from a dispense nozzle and/or valve. After dispense, a corresponding valve can be closed and with process fluid pressure above the pressure of common fluid, this bladder will begin collecting a charge of process fluid until reaching a physical expansion limit (or until its valve is opened again). Once expanded with process fluid, this bladder can remain ready for dispense until signaled to dispense.

Each bladder then, in an expanded state, is essentially in hydrostatic lock when not dispensing. For example, a given process fluid pressure for causing expansion may be 6 psi. 6 psi is greater than the control fluid range of 3-5 psi. Each bladder can then have process fluid pressure increased above the expansion threshold. For example, process fluid pressure within each bladder can be maintained between 8 psi to 16 psi. This provides a range of pressures for manipulating dispense pressures. For example, If bladder pressures are at 12 psi and one bladder begins dispensing, then during this dispense, bladder pressures of remaining bladders can be controllably lowered during this dispense (such as from 12 psi to 9 psi) to maintain a constant dispense pressure for the dispensing bladder. Note that 9 psi is still well above the expansion threshold, thus all other bladders remain in hydrostatic lock.

Accordingly, each bladder can be independently controlled and dispensed regardless of a charging, waiting or dispensing state of the other bladders.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

" Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. An apparatus for fluid delivery, the apparatus comprising:
 a pressurized fluid housing defining a pressure-control chamber, the pressurized fluid housing configured to contain a common pressure-control fluid;
 a plurality of bladders positioned within the pressure-control chamber, the plurality of bladders having respective bladder process fluid inlets and bladder process fluid outlets, each respective bladder process fluid inlet connected to a corresponding chamber process fluid inlet of the pressure-control chamber, each respective bladder process fluid outlet connected to a corresponding chamber process fluid outlet of the pressure-control chamber, each bladder defining a linear flow path between a respective bladder process fluid inlet and a corresponding bladder process fluid outlet, each bladder being configured to expand and contract within the pressure-control chamber such that a volume defined by each bladder is changeable, each bladder configured to receive process fluid from a respective pressure-control delivery system configured to controllably adjust fluid pressure of process fluid delivered to each bladder;
 the pressure-control chamber configured to contain a common pressure-control fluid such that when the pressure-control chamber is filled with the common pressure-control fluid, the common pressure-control fluid is in contact with an exterior surface of each bladder of the plurality of bladders, the pressure-control chamber including a chamber pressure-control mechanism that selectively increases or decreases a fluid pressure of the common pressure-control fluid resulting in an increase or decrease in pressure exerted on exterior surfaces of each bladder; and
 a controller configured to activate the chamber pressure-control mechanism and selectively increase or decrease the fluid pressure of the pressure-control fluid exerted on each bladder such that the volume defined by each bladder selectively increases or decreases according to process fluid pressure within each bladder.

2. The apparatus of claim 1, further comprising:
 a bladder expansion constraint configured to physically limit expansion of each bladder to a respective maximum bladder volume.

3. The apparatus of claim 2, wherein the bladder expansion constraint defines one or more openings that permit common pressure-control fluid to travel between each bladder and bladder-facing surfaces of the bladder expansion constraint.

4. The apparatus of claim 2, wherein the bladder expansion constraint defines a surface for contact with an exterior surface of each bladder.

5. The apparatus of claim 4, wherein the pressure-control chamber defines bladder-facing surfaces that surround each bladder and define a bladder expansion shape with sufficient bladder contact surface area to physically restrain bladder expansion.

6. The apparatus of claim 2, wherein the bladder expansion constraint has an elongated shape with a center portion defining a larger cavity diameter as compared to end portions of the bladder expansion constraint.

7. The apparatus of claim 2, wherein the bladder expansion constraint includes bladder sleeves with a respective bladder sleeve positioned around each bladder, each respective bladder sleeve approximately conforming to a shape of a corresponding expanded bladder.

8. The apparatus of claim 2, wherein the bladder expansion constraint is configured with sufficient surface area and rigidity such that after a respective bladder fully contacts the bladder expansion constraint, additional volumetric expansion of the bladder is limited to less than 1 percent of bladder volume at time of full contact with the bladder expansion constraint.

9. The apparatus of claim 1, wherein at least one of the bladders from the plurality of bladders is configured for use as the chamber pressure-control mechanism.

10. The apparatus of claim 1, wherein the controller is configured to selectively expand a first portion of the bladders without expanding a second portion of the bladders.

11. The apparatus of claim 10, wherein the controller is configured to adjust the fluid pressure of the common pressure-control fluid to simultaneously dispense from one or more bladders while accumulating a charge of process fluid in one or more remaining bladders.

12. The apparatus of claim 1, wherein the controller is configured to selectively contract one or more bladders without contracting a second portion of the bladders.

13. The apparatus of claim 1, wherein the controller is configured to selectively control each respective pressure-control delivery system for each bladder.

14. The apparatus of claim 12, wherein the controller is configured to increase the fluid pressure of the pressure-control fluid while simultaneously causing a corresponding increase of process fluid pressure within each bladder of the second portion of bladders via respective pressure-control delivery systems.

15. An apparatus for fluid delivery, the apparatus comprising:
- a pressurized fluid housing defining a pressure-control chamber, the pressurized fluid housing configured to contain a common pressure-control fluid;
- a plurality of bladders positioned within the pressure-control chamber, the plurality of bladders having respective bladder process fluid inlets and bladder process fluid outlets, each respective bladder process fluid inlet connected to a corresponding chamber process fluid inlet of the pressure-control chamber, each respective bladder process fluid outlet connected to a corresponding chamber process fluid outlet of the pressure-control chamber, each bladder defining a linear flow path between a respective bladder process fluid inlet and a corresponding bladder process fluid outlet, each bladder being configured to expand and contract within the pressure-control chamber such that a volume defined by each bladder is changeable, each bladder configured to receive process fluid from a respective pressure-control delivery system configured to controllably adjust fluid pressure of process fluid delivered to each bladder;
- the pressure-control chamber configured to contain a common pressure-control fluid such that when the pressure-control chamber is filled with the common pressure-control fluid, the common pressure-control fluid is in contact with an exterior surface of each bladder of the plurality of bladders, the pressure-control chamber including a chamber pressure-control mechanism that selectively increases or decreases a fluid pressure of the common pressure-control fluid resulting in an increase or decrease in pressure exerted on exterior surfaces of each bladder;
- a bladder expansion constraint configured to physically limit expansion of each bladder to a respective maximum bladder volume, the bladder expansion constraint defining one or more openings that permit common pressure-control fluid to travel between each bladder and bladder-facing surfaces of the bladder expansion constraint; and
- a controller configured to activate the chamber pressure-control mechanism and selectively increase or decrease the fluid pressure of the pressure-control fluid exerted on each bladder such that the volume defined by each bladder selectively increases or decreases according to process fluid pressure within each bladder.

* * * * *